(12) United States Patent
Zettsu

(10) Patent No.: US 9,298,240 B2
(45) Date of Patent: *Mar. 29, 2016

(54) MEMORY DEVICE, CONTROL METHOD FOR THE MEMORY DEVICE, AND CONTROLLER

(71) Applicant: KABUSHIKI KAISHA TOSHIBA, Tokyo (JP)

(72) Inventor: Tatsuya Zettsu, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/483,220

(22) Filed: Sep. 11, 2014

(65) Prior Publication Data

US 2014/0379972 A1    Dec. 25, 2014

Related U.S. Application Data

(63) Continuation of application No. 13/601,923, filed on Aug. 31, 2012, now Pat. No. 8,862,809.

(30) Foreign Application Priority Data

Sep. 13, 2011    (JP) .................................. 2011-199855

(51) Int. Cl.
*G06F 12/02*    (2006.01)
*G06F 1/30*    (2006.01)

(52) U.S. Cl.
CPC ...... *G06F 1/30* (2013.01); *G06F 12/02* (2013.01); *G06F 12/0246* (2013.01); *G06F 2212/1032* (2013.01); *G06F 2212/7205* (2013.01)

(58) Field of Classification Search
None
See application file for complete search history.

(56) References Cited

U.S. PATENT DOCUMENTS

| 5,533,190 | A | | 7/1996 | Binford et al. |
| 5,581,723 | A | * | 12/1996 | Hasbun et al. ................ 711/103 |
| 7,185,140 | B2 | | 2/2007 | Nakajima |
| 7,558,904 | B2 | | 7/2009 | Nakajima |
| 7,634,688 | B2 | | 12/2009 | Madter et al. |
| 7,954,006 | B1 | * | 5/2011 | Mangipudi ............... G06F 1/30 713/340 |
| 7,962,686 | B1 | * | 6/2011 | Tracht .......................... 711/103 |
| 7,992,076 | B2 | * | 8/2011 | Raja ............................. 714/807 |
| 8,130,554 | B1 | | 3/2012 | Linnell |
| 8,767,354 | B1 | * | 7/2014 | Ferris et al. ................... 360/272 |
| 2005/0283648 | A1 | | 12/2005 | Ashmore |
| 2008/0024899 | A1 | * | 1/2008 | Chu et al. ........................ 360/69 |
| 2010/0106896 | A1 | * | 4/2010 | Bildgen ............. G06F 12/0246 711/103 |

(Continued)

FOREIGN PATENT DOCUMENTS

| JP | H07-160597 A | 6/1995 |
| JP | 11-039221 | 2/1999 |

(Continued)

OTHER PUBLICATIONS

Office Action for Japanese Patent Application No. 2011-199855, dated Jan. 28, 2014, English Translation, 5 pages.

*Primary Examiner* — Duc Doan
(74) *Attorney, Agent, or Firm* — Patterson & Sheridan, LLP

(57) ABSTRACT

During normal power operation, an erased free block is prepared in nonvolatile memory so that at least one erased free block is continuously available as a standby block. If a power failure occurs, volatile data and its address conversion information are written into the standby block in the nonvolatile memory.

20 Claims, 9 Drawing Sheets

(56) References Cited

U.S. PATENT DOCUMENTS

| | | | |
|---|---|---|---|
| 2011/0113184 A1* | 5/2011 | Chu | G06F 11/1441 711/103 |
| 2012/0089854 A1* | 4/2012 | Breakstone | G06F 1/30 713/323 |
| 2012/0254503 A1 | 10/2012 | Chiu et al. | |

FOREIGN PATENT DOCUMENTS

| | | |
|---|---|---|
| JP | 2002-049536 A | 2/2002 |
| JP | 2006-127648 A | 5/2006 |

\* cited by examiner

LBA NOT WRITTEN IN NAND AT THE POINT IN TIME OF IMPROPER ELECTRIC SOURCE CUTOFF

DATA WRITTEN IN THE SHELTER BLOCK

DATA WRITTEN IN NAND AFTER THE ELECTRIC SOURCE INTRODUCTION

DATA STORED ORIGINALLY IN NAND AT THE POINT IN TIME OF IMPROPER ELECTRIC SOURCE CUTOFF

MEMORY DEVICE, CONTROL METHOD FOR THE MEMORY DEVICE, AND CONTROLLER

CROSS-REFERENCE TO RELATED APPLICATION

This application is a continuation of U.S. patent application Ser. No. 13/601,923, filed on Aug. 31, 2012, which is based upon and claims the benefit of priority from Japanese Patent Application No. 2011-199855, filed Sep. 13, 2011, the entire contents of which are incorporated herein by reference.

FIELD

Embodiments described herein relate to a memory device provided with a nonvolatile semiconductor memory, a control method for the memory device, and a controller.

BACKGROUND

An SSD (Solid State Drive) includes multiple flash memory chips that serves as nonvolatile semiconductor memory, a controller for carrying out read/write control of the flash memory chips as required by the host device, a buffer memory between the flash memory chips and the host device, a power supply circuit, an interface to the host device, and so on.

Power supplied by an external power source may cut off abruptly without previous notice while the SSD is in use. When this happens, any volatile data that may be present in volatile memory must be stored persistently. Therefore, the SSD has a backup power source such as a battery, a capacitor, or other similar backup system to guard against loss of data stored in the volatile memory during outages.

A capacitive backup power supply often is capable of supplying electric power for an extremely short time, between roughly 10 ms and 0.1 sec. Therefore the data stored in the volatile memory should be processed within a time as short as possible during outages.

DETAILED DESCRIPTION

With reference to the following attached diagrams, a memory device, its control method, and a controller according to an embodiment will be explained in detail. The present invention is not to be restricted to this embodiment.

For example, during an unexpected outage, if a block is erased, and data need to be written to this erased block, the time required to erase the block may not allow enough time for the data to be written. Furthermore, if data are being read out from the flash memory with error correction and a sudden outage occurs, if the readout and error correction continue before the backup electric source kicks in, some data may be lost.

According to an embodiment, there is provided a memory device, a control method for the memory device, and a controller capable of permanently storing the data during a power outage by using a backup electric source with a small capacity.

The memory device of the present embodiment is provided with a volatile primary memory and a nonvolatile secondary memory with multiple blocks serving as data erasing units. The memory device is further equipped with a controller for reading and writing to the primary memory, and the control information, which is stored in the second memory, includes the address conversion information associated with the physical location of stored data in the second memory and the logical address specified by the host device. This transmitted control information is used to write the data from the host device via the primary memory to the secondary memory and, at the same time, to read out the data from the secondary memory through the primary memory to the host device. Further, the memory device is provided with a backup power source and an electric circuit that delivers external power supply to various parts in the memory device. Once an outage is detected, the backup circuit supplies power at various locations within the storage device. The controller has an erased block management section to prepare the erased free blocks so that at least one erased free block is always available as a standby in the secondary memory during normal operation (no power outage), and a control section for storing volatile data and the associated address conversion information during an outage.

The terminology used in the present specification will now be defined.

Page: This refers to a unit of writable/readable addresses within the NAND flash memory.

Block: This is the erasable unit of addresses in the NAND flash memory, and each block includes multiple pages.

Sector: This refers to the minimum access unit from the host. The sector size is, for example 512B.

Free block (FB): This refers to a block that is unassigned for use and contains no valid data.

Active block (AB): A block containing valid data.

NAND update: This refers to the process for rewriting the blocks with the latest valid data gathered.

Figure 1:
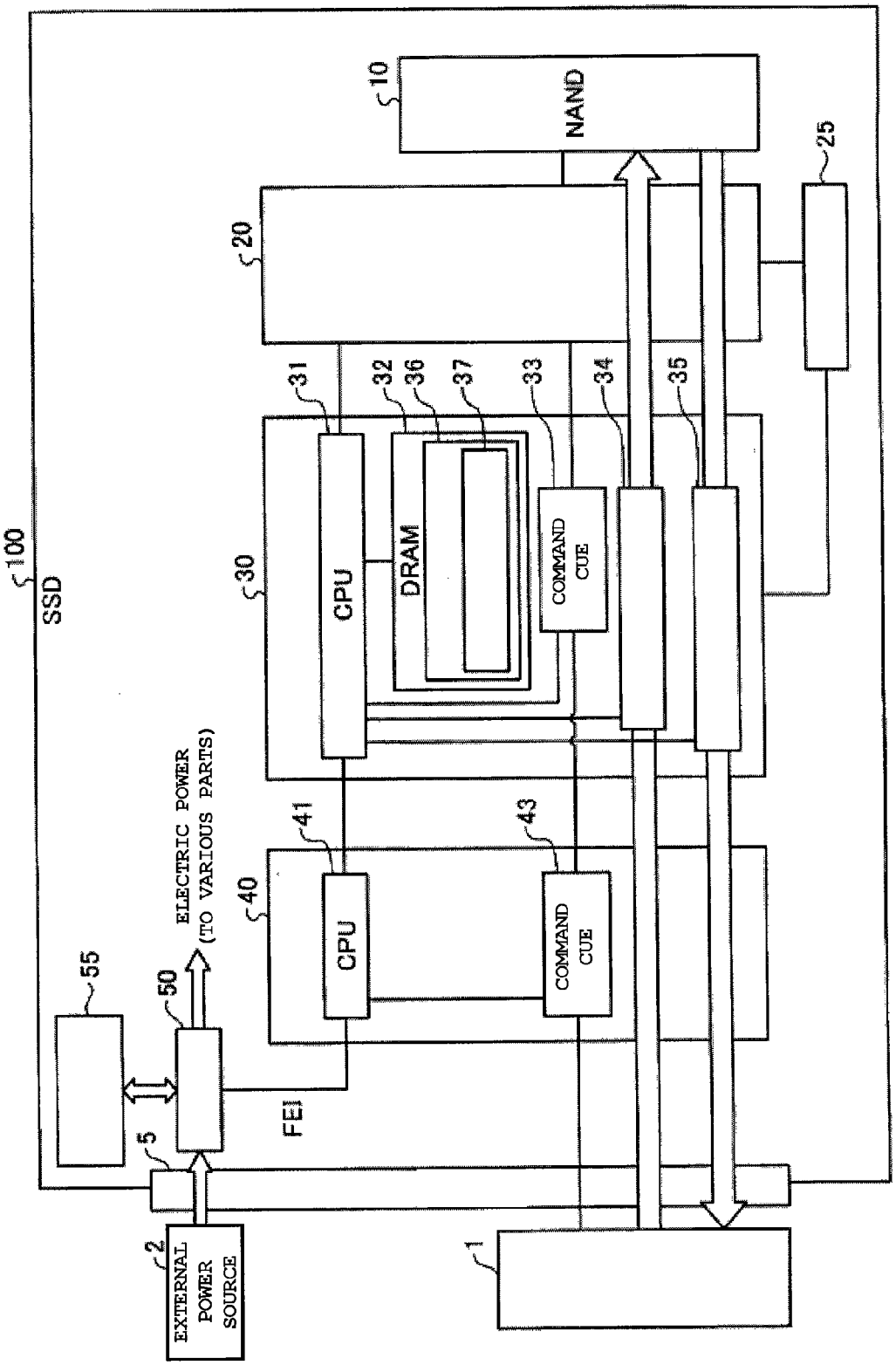
FIG. 1 is a block diagram of an example SSD.

FIG. 1 is a functional block diagram showing one embodiment of the SSD 100. The SSD 100 is connected to the host 1 such as a personal computer, via a host interface 5 of an SAS (Serial Attached SCSI) interface or a SATA (Serial Advanced Technology Attachment) interface or similar, and functions as the external memory of the host 1. One can take the host 1 to be the CPU of a personal computer, the CPU of a still camera, a video camera, or other photographic device, etc. We will use "host interface command" (host IF command) to refer generally to the SAS command, the SATA command, and so on.

The SSD 100 uses NAND flash memory 10 as its nonvolatile semiconductor memory. A front end 40 transmits and receives data from the host 1 via the host interface 5 when processing a host IF command. A back end 30 of the SSD 100 translates the host IF command into a command suitable for the NAND 10. The NAND controller 20 drives the NAND 10, an error correction circuit 25 performs encoding and decoding of the error-correcting codes for storage in and readout from NAND 10. The power supply circuit 50 supplies power to each circuit in the SSD 100, and a rechargeable battery 55 serves as a backup power source.

When the host 1 issues a read or write IF request to SSD 100, the command includes the LBA (Logical Block Addressing) as a logical address. This is a logical address numbered from 0 to 512B, for example. The SSD 100 accepts the read and write requests of user data specifying the LBA, etc., from the host 1. In the case of a read request, SSD 100 sends the user data stored in the NAND 10 via the read buffer 35 to the host 1. In the case of a write request, the user data received from the host 1 are stored in the NAND 10 via the write buffer 34.

The NAND 10 includes a matrix of memory cells, and the individual memory cells that can support multilevel memory by using the upper and lower pages. The NAND 10 includes multiple memory chips, which is configured by arranging multiple blocks as a unit of data erasing. The NAND 10 reads and writes data one page at a time. Each block is composed of more than one page, and each page includes multiple data sectors.

In the SSD 100 of this embodiment, a small control unit is used to manage the user data in the NAND 10. The NAND 10 is controlled by a single unit. Any unit will do, provided its size is larger than a sector but smaller than a block. In this embodiment, the control unit size equals one page. Within each page or LBA sector, the data are stored in order at a position corresponding to the LBA. Within a block, the data are appended to every page, but between pages the data need not necessarily be stored in order of the LBA.

The front end portion 40 has a CPU 41 and a command queue 43 and serves mainly to process the host IF command. This function of end portion 40 is implemented in software (or firmware) on the CPU 41. The command queue 43 can store several host IF commands from the host 1. If the command is a read write request for user data by LBA, it transmits the command to the back end section 30. The CPU 41 at the front end 40 coordinates with the CPU 31 at the back end 30 and processes the data between the write buffer 34 and host 1 and between the read buffer 35 and host 1.

The back end 30 includes the CPU 31, DRAM 32, command queue 33, write buffer 34, and read buffer 35. The back end portion 30 is intended to perform the various processes to convert the IF commands to the commands for the host NAND 10. This function is realized by software (and/or firmware) running on the CPU 31. The back end 30 responds to various commands, such as read or write requests, from the host 1; updates the management information such as the address conversion table and so on to map the logical addresses in the host 1 to the physical addresses (i.e., the memory locations) in the NAND 10; controls volatile data processing; and organizes the NAND 10, etc. The management table 36 (also known as the master table) is stored in DRAM 32 and contains the address conversion table 37 mapping the LBA logical addresses to the memory locations (block address+page address inside the block) of the data in the NAND 10. The CPU 31 registers and updates the management table 36. This management table 36 is also stored in the NAND 10 and, during initialization, the management table 36 stored in the NAND 10 is copied to DRAM 32. The management table 36 in DRAM 32 is protected and stored in the NAND 10 periodically and/or when power is cut off.

The command queue 33 has a structure capable of storing more than one command. For the commands received by the command queue 33 from the front end 40, e.g., read or write requests, the address conversion table 37 in DRAM 32 is used to translate the LBA into the physical address in the NAND 10. The command queue 33 outputs the read or write request, including the translated physical address, sequentially to the NAND controller 20. The request to write user data sent from the host 1 is implemented in NAND 10 as page units. The write buffer 34 is a volatile memory to temporarily store user data to be written to the NAND 10. The read buffer 35 is a volatile memory to temporarily store and then pass on to the host 1 user data read from the NAND 10. The write buffer 34 and the read buffer 35 use random access memory that can be volatile.

It is also acceptable for the write buffer 34 and the read buffer 35 to reside in the DRAM 32. For a volatile semiconductor memory used in the backend 30, any RAM that is capable of faster storing than NAND 10, random access, and that requires no erasing, such as SRAM and FeRAM, may be used in addition to DRAM 32.

On receipt of a request from the backend 30, the NAND controller 20 reads/writes the user data from/to the NAND 10. The NAND controller 20 uses an error correcting circuit 25 and handles the encoding during ECC processing (error correcting code processing) when writing user data to the NAND 10, and outputs it with the addition of the encoding results. The NAND controller 20 uses the error correcting circuit 25 to decode (i.e., ECC-process) the data read from the NAND 10, and outputs the corrected data to the backend 30. The CPU 31 in the backend 30 can be instructed to halt ECC processing by the error correction circuit 25.

The power supply 50 converts direct current supplied from the external power source 2 into several different internal DC source voltages, which are fed to the SSD 100. If interruption of power from the external source 2 is detected, the power source 50 switches over to the battery 55 and issues a power failure alert to the CPU 41 in the front end 40. Then the CPU 41 in the front end 40 detects power failure and the CPU 31 in the backend section 30 is commanded to reaction to the power failure condition.

Figure 2:
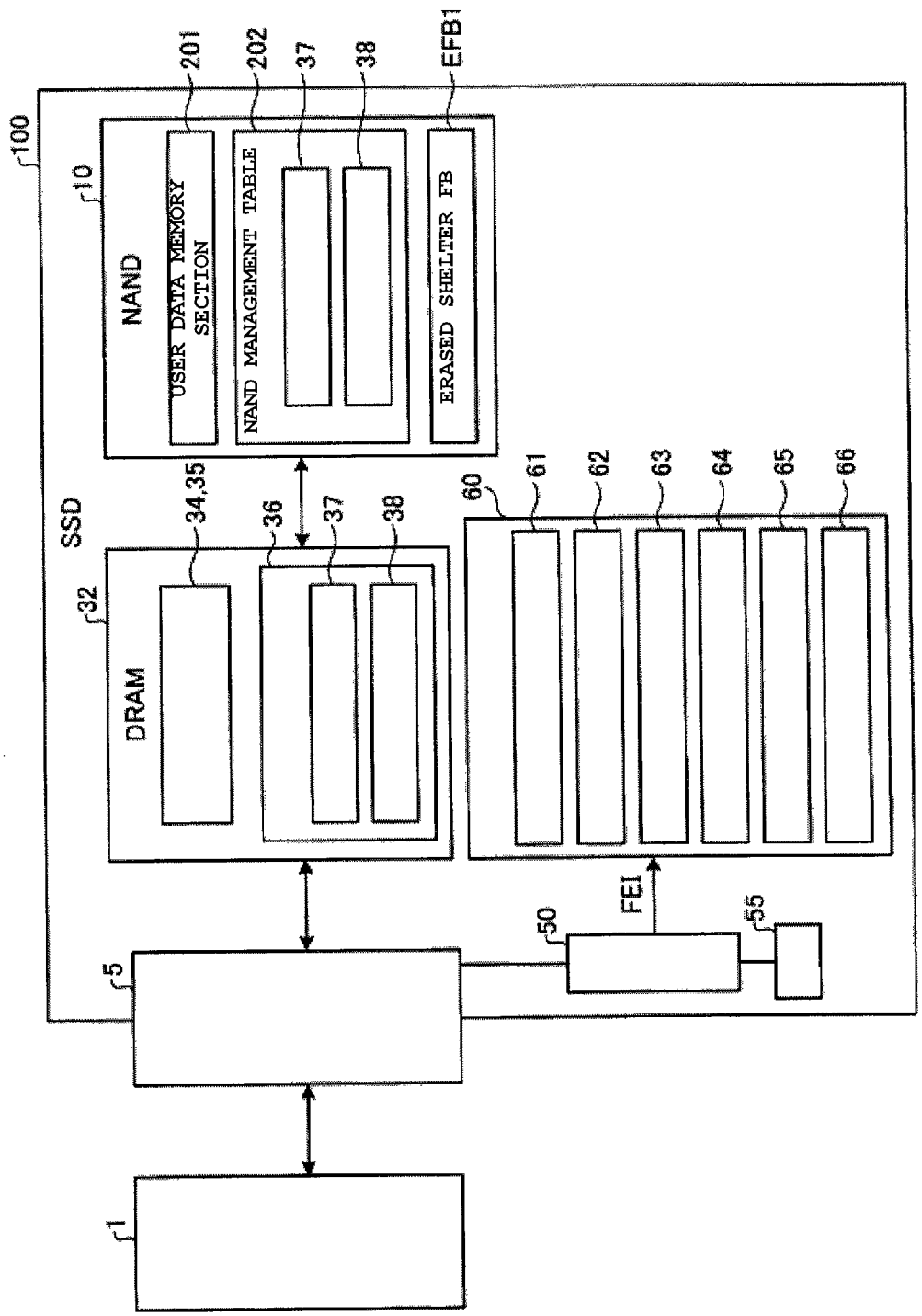
FIG. 2 is a block diagram of the example SSD showing other features of the SSD.

FIG. 2 is a functional block diagram showing the main components of the SSD 100. The NAND 10 has a user data section 201 that stores the user data. The NAND management table 202 (which includes the address conversion table 37, the free block list 38, etc.) is stored in the NAND 10.

The write buffer 34 and the read buffer 35 reside in DRAM 32. During startup, etc., the management table 36 deployed in DRAM 32 is stored as the NAND management table 202.

The controller 60 as a functional element includes the front end 40, the backend 30 plus the NAND controller 20 with the command processor 61, read/write controller 62, a NAND garbage collector 63, a free block manager 64, an erase block manager 65, and a power outage handler 66.

The command processor 61 analyzes the commands from the host 1 and sends the results to the read-write controller 62, the NAND garbage collector 63, the free block manager 64, the erase block manager 65, and the power outage handler 66. The command processor 61 transmits the command response from the SSD 100 to the host 1.

The read-write controller 62 controls the writing of data input from the host 1 to the write buffer 34, the reading of data from the write buffer 34 to the NAND 10, and the updating of the various management tables, etc. The read-write controller 62 also reads the data specified by the host 1 from the NAND 10, which passes through the read buffer 35 to the host 1, and handles the updating of the various management tables, etc. When reading and writing to the NAND 10, the read-write controller 62 performs ECC using the error correcting circuit 25.

The NAND garbage collector 63 arranges the data in the NAND 10. When the size of the erasing unit (block) of the data in the NAND 10 differs from the size of the data being managed, as the NAND 10 is rewritten, invalid data, i.e. data that is outdated, will be incorporated and the block will become full of holes. As the number of such blocks increases, fewer blocks will be available for use and effective utilization of the NAND memory 10 becomes impossible. For example, when the number of free blocks in the NAND 10 falls below a specified threshold value, the latest valid data are collected and the NAND 10 organizer compacts, write-corrects, and garbage-collects the data in the NAND 10, and the list of free blocks is updated.

The free block manager 64 manages the free blocks by using the free block management list (FB management list) 38 in the master table 36. Free blocks FB are distinguished from active blocks AB. A free block FB is a logical block that has not been assigned for use and which contains no valid data. An active block AB is a logical block that is in use and contains valid data. In the SSD 100, the mapping of logical address (LBA) to physical address (the memory location in the NAND 10) is not static but has to be updated dynamically as data are written.

For example, to overwrite data in the same LBA, the following actions are performed. Valid data of with a size of one block size are stored in the logical address A1, and the memory block B1 is currently use to store the data associated with logical address A1. When a request to update data with the same block size as the logical address A1 is received from the host 1, the data from the host 1 is written to the free block B2 and the address mapping of A1 to B2 is updated. This makes B2 become an active block AB, and since the data in the block B1 is now stale, it becomes a free block FB.

Thus, even for data at the same logical address A1, the block in the SSD 100 used to hold the data will change as writing proceeds. When updating data of block size, the destination block will necessarily change. However, when the size of the data to be updated is less than the block size, sometimes it is possible to write to the same block. For example, if a page of data contained in a block needs to be updated, the old page at the same logical address inside the block is invalidated and the new page holding the data becomes the valid page. If all data inside the block is invalidated, the block is released as a free block FB.

The free blocks FB are managed by the FB management list 38. The FB management list 38 determines which free block will be selected next as the write destination block. The FB list 38 is a FIFO queue sorted by the time the blocks become free or by the number of times the block has been erased, for example. Each entry is maintained as a block identifier. The free block FB obtained when an active block AB becomes a free block FB is added to the FB list and subsequently dropped from it when reused. The FB management list employs a write-spreading algorithm to equalize the number of erase cycles and erase intervals for all the blocks. When a block is needed for writing, the free block manager 64 chooses a free block FB based on the FB management list 38. The block is erased and becomes available for writing by the read-write controller 62.

Under ordinary conditions, i.e., in the absence of power outage, the erased block manager 65 handles the erasing of the free block so that at least one erased free block is always kept available as a standby block. For example, when free blocks are erased, at least one erased free block FB-A is prepared. This erased free block FB-A is not to be used as the write destination block until another erased free block has been prepared. Later, when a free block is needed for writing, another free block is first erased to prepare, for example, the erased free block FB-B. The erased free block FB-A prepared previously is then used as the write destination. This process is repeated—whenever a free block is needed for writing, another free block is erased and the erased free block FB-C is prepared. The block FB-B prepared the previous time is then used as the write destination. The erased block manager 65 prepares the erased free blocks as directed by the FB management list 38.

When a power failure alert is received signaling an unexpected power outage from the external power source 2, the power outage handler 66 performs the following process after unexpected power outage occurs and during the time that power is supplied from the battery 55. When prompted to write user data from the host 1, the data is temporarily stored in the write buffer 34 in the SSD 100 and a write completion signal is returned to the host 1. In this way, the latency associated with writing the user data from the host 1 is improved in the SSD 100. Regarding the write completion signal sent to the host 1, after unexpected power outage, the write must be performed to the nonvolatile NAND 10 from the volatile write buffer 34 while the backup battery 55 is supplying power. However, as described above, the battery 55 typically supplies power for only a short time, from 10 ms to 0.1 sec or so. Therefore, writing to nonvolatile memory when a power failure alert is received must be as fast as possible.

Thus, the power outage handler 66 performs the following actions:

The erased free block set aside previously by the erased block manager 65 prior to the power failure alert is used to hold the contents of the DRAM 32 in nonvolatile memory. Specifically, the contents of the DRAM 32 stored in the erased free block include the management information, the user data temporarily stored in the write buffer 34, etc. The volatile user data for which the host 1 acknowledges the write completion signal is now safely stored in the erased free block. In addition, the volatile management information in the master table 36 is safely written to the erased free block.

An erase request is canceled if the block of NAND 10 is currently being erased.

A garbage collection request is canceled if it is already in progress.

Reading from the NAND 10 and error correction during readout are also interrupted.

Read-modify-write (RMW) processing is interrupted.

Now, the read-modify-write cycle is explained. When part of a sector in a page needs to be updated, data are read from the NAND 10, the update is made, and read-modify-write (RMW) processing is performed. In the RMW process, the page or block containing the updated sector is first read from the NAND 10, and such read data is combined with, for example, the updated data received from the host 1 in the DRAM 32. The combined data are then written to a new page or block in the NAND 10.

Erasing Process

Figure 3:
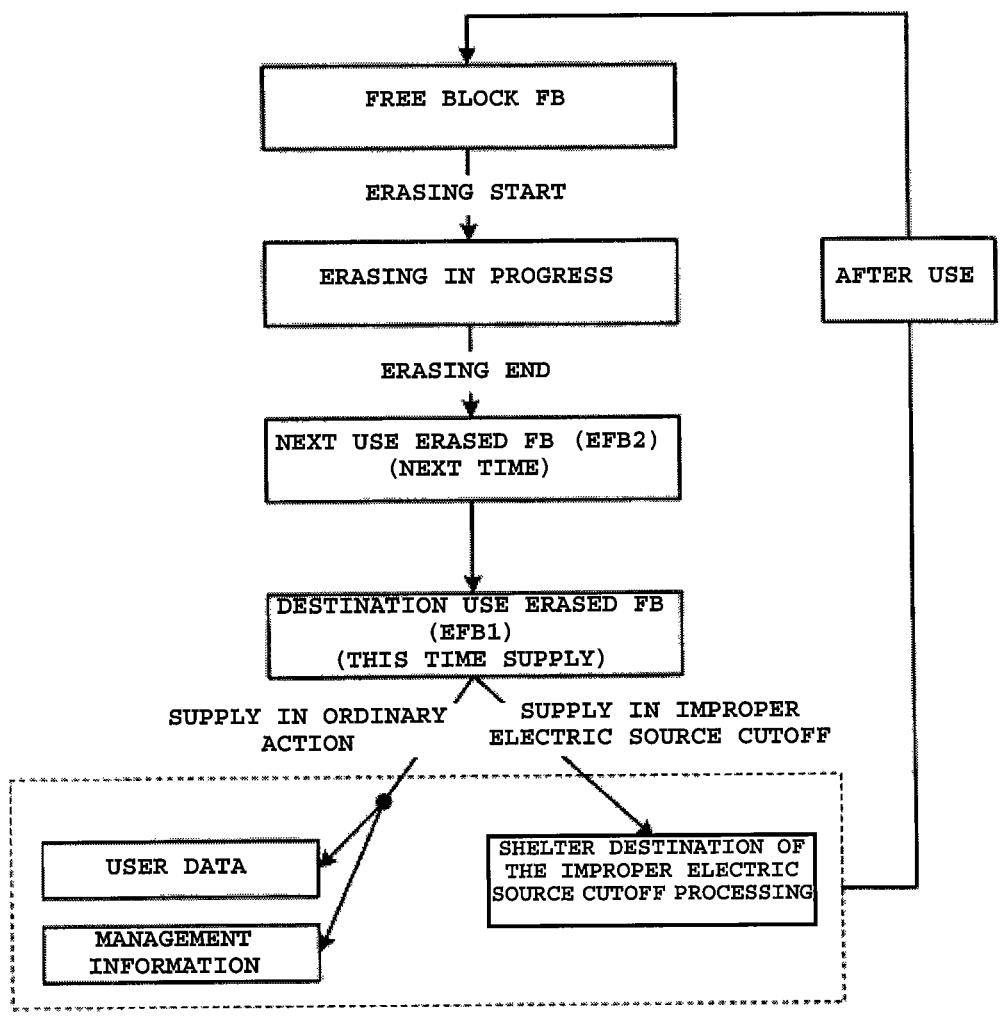
FIG. 3 is a conceptual diagram showing the state transitions of an SSD data block.
Figure 4:
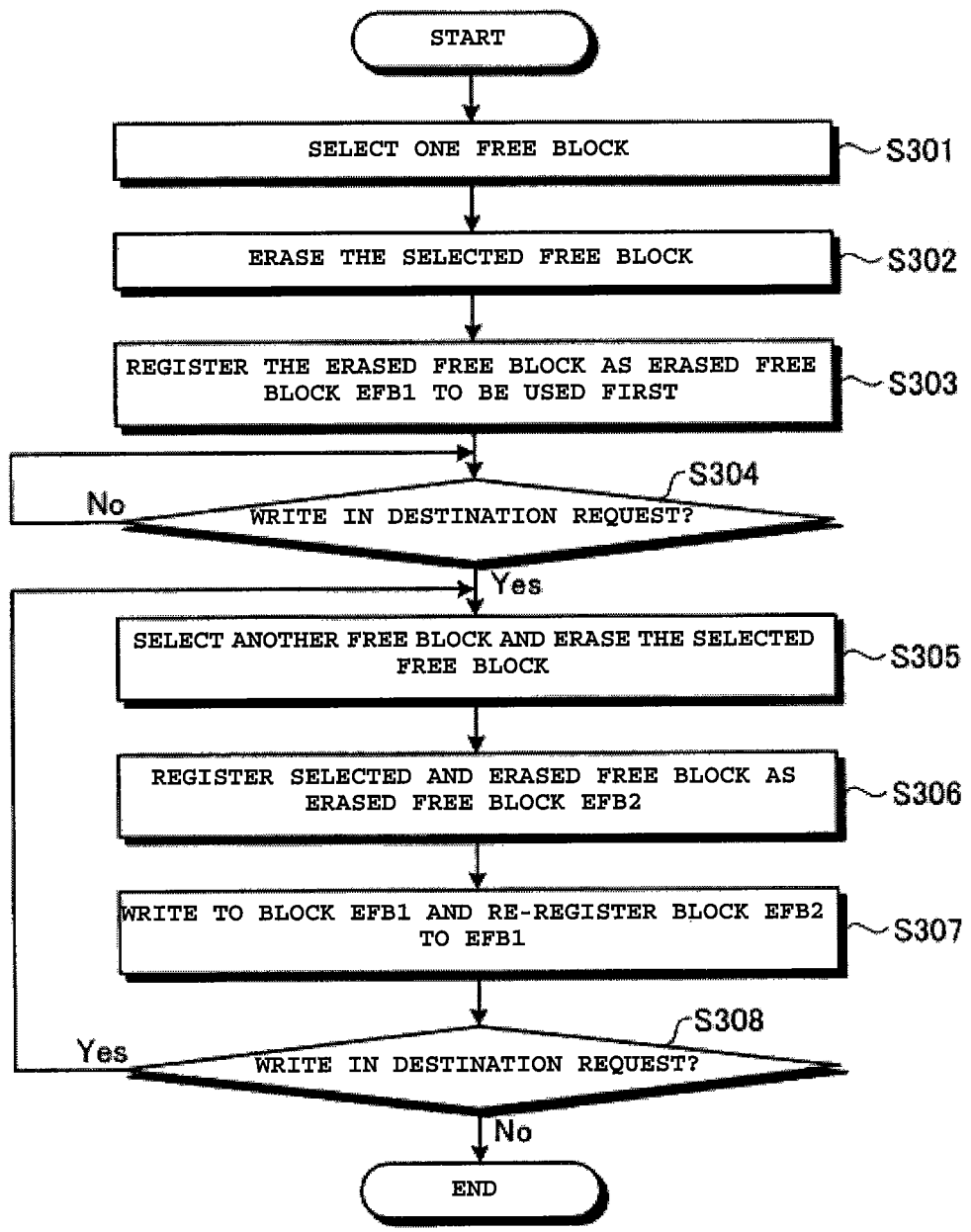
FIG. 4 is a flow chart showing a process used to provide erased free blocks.

We will next refer to FIG. 3 and FIG. 4 to describe how a block is erased in coordination with the erased block manager 65. FIG. 3 shows the state transitions for the block. FIG. 4 shows how an erased block is prepared prior to a power failure alert. The block shown in FIG. 3 is in its initial state where it is a free block FB and holds no valid data. After erasure, this free block FB is ready to have data written thereto. If the erasure process is interrupted before completion, the block returns to the free block list of candidates for erasure. Once erased, the free block FB is used as active block AB to receive user or control data. Once used, the block in question is registered again as a free block FB.

In the present embodiment, for example, during normal power operation, the first block in the FB manager list 38 is selected (step S 301) and erased, and (step S302) at least one erased free block FB-A is prepared beforehand. This erased free block FB-A, as shown in FIG. 3, is registered as the erased free block EFB1 to be used first (step S303). As described above, data is not written to the erased free block EFB1 until another erased free block has been prepared.

When the free block is requested as the write destination (step S304), another free block is erased to prepare another erased free block FB-B (step S305). This erased free block FB-B, as shown in FIG. 3, is registered as the erased free block EFB2, which is only written to after erased free block EFB1 is written to (step S306). The erased free block FB-A, prepared previously and registered as the erased free block EFB1, is then written to. The erased free block FB-B, which is already prepared for writing and is registered as the erased free block EFB2, is now re-registered as the erased free block EFB1, which is the next block to be used for writing (step S307).

This process is then repeated when the current free block is requested as a write destination (step S308)—another free block is first selected and erased (step S305) so that another erased free block FB-C is prepared. This erased free block FB-C is registered as the next-use block EFB2 to be written to the next time (step S306). The erased free block FB-B currently registered as EFB1 is now written to, and, finally, the erased free block FB-C prepared this time and registered as EFB2 is promoted to EFB1 (step S307).

The erased free block registered as the erased free block EFB1 to be used first, as shown in FIG. 3, is normally used as the write destination for user or control data. However, if a power failure alert is present, the block is used as the write destination for user or control data in power failure recovery mode.

The erased block manager 65 always sets aside at least one erased free block to be used as the nonvolatile write destination during a power outage. Therefore, if an outage occurs data can be written immediately to nonvolatile memory using this free block because it has already been erased. It takes ~10 ms to erase a block. Erasing may require more time that is needed to store data in nonvolatile memory during a power outage and is therefore avoided at FE1. By using the first free block previously erased and set aside as the write destination, write performance may be maintained.

Power Interruption Recovery

Figure 5:
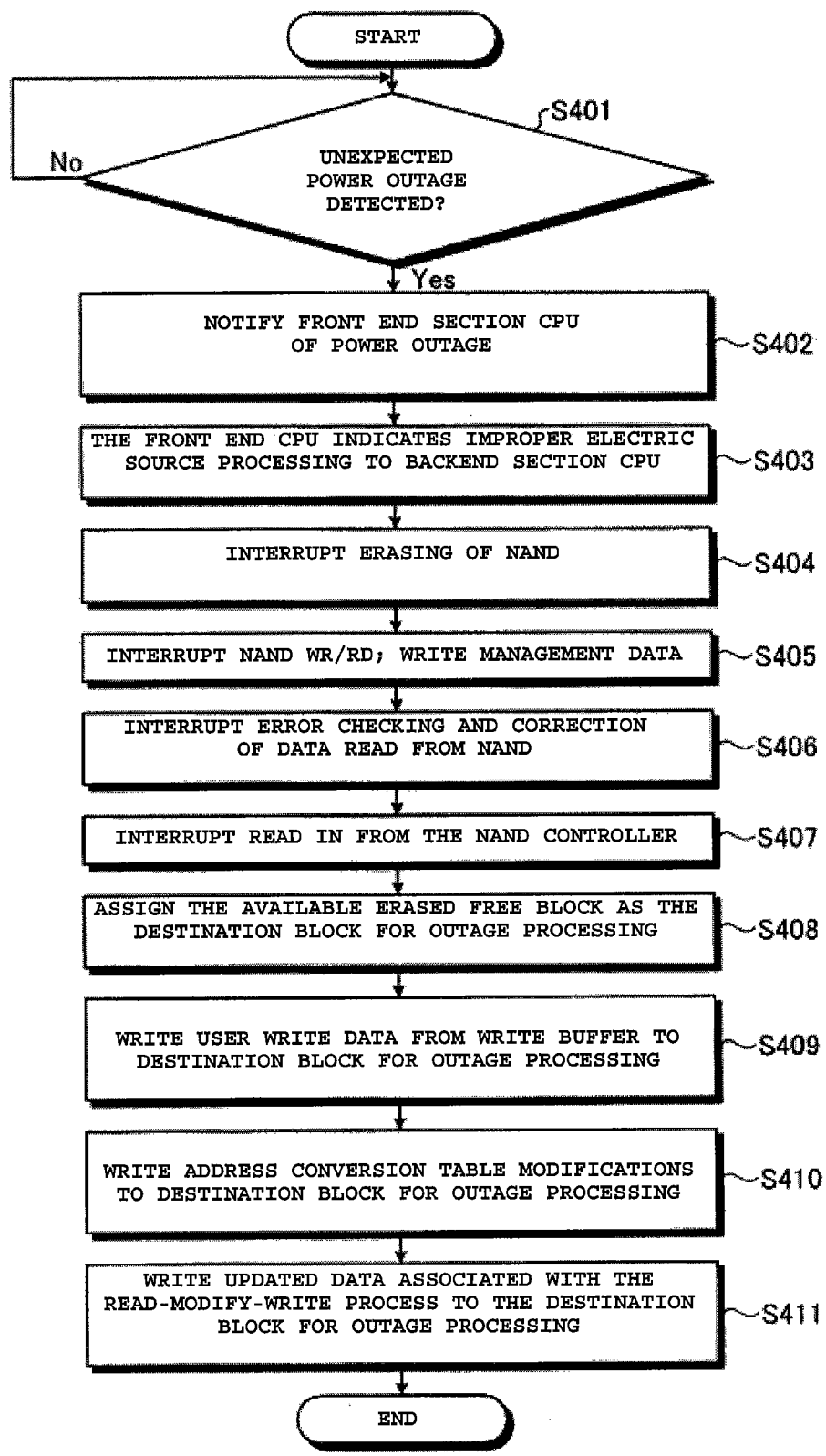
FIG. 5 is a flow chart showing a process executed during unexpected outages.

The flow chart in FIG. 5 shows the actions performed in the power outage handler 66 when an unexpected power outage occurs and a power failure alert is received from the power source circuit 50. Until an interruption of power from the external power source 2 is detected (step S 401: No), the source 50 continues to supply electrical power from external power source 2 to various sections of the SSD 100. When an outage from external power source 2 is detected (step S 401: Yes), the source 50 switches to battery backup 55. In addition, the power source circuit 50 sends a power failure alert alerting the CPU 41 in the front end 40 that an outage has occurred in the external power source 2 (step S 402). The front end 40 then stops issuing commands to the backend 30. In addition, the CPU 41 in the front end 40 informs the CPU 31 in the backend 30 that outage recovery is underway (step S403).

The power outage handler 66 then takes over and handles the power outage processing in the CPU 31 of the backend section 30. The power outage handler 66 tells the NAND controller 20 to interrupt any erasing that may be in progress in the NAND 10 (step S404), and any erasing is halted.

The power outage handler 66 also interrupts any activity of the NAND garbage collector 63 (step S405). Specifically, writing and reading to and from the NAND 10 and updating of the address conversion table 37 in the master table 36 are suspended. In step S410, described below, data in the address conversion table 37 or other management information that has been updated by the NAND garbage 63 but not written to the NAND 10, is written to the erased free block EFB1 that is designated to be used first as the protected destination block described above. Consequently, when external power is again established, the management information stored in the NAND 10 is consistent.

The power outage handler 66 tells the ECC 25 not to perform error checking and correction on data read from the NAND 10 (step S406). In other words, any ECC underway on data read from the NAND 10 is interrupted. Any subsequent uncorrected read errors are handled as read exceptions (within NAND 10).

The power outage handler 66 then interrupts reading by the NAND controller 20 (step S407). Any read in progress from the NAND 10 is allowed to complete, but thereafter all reading is interrupted. In addition, reads requested by the host 1 are not acknowledged and the power outage handler 66 also stops.

The power outage handler 66 assigns the erased free block EFB1 kept in the erased block manager 65 as the protected destination block for outage processing (step S408).

The power outage handler 66 writes the user data for which a write completion has been sent to the host 1 in the protected destination block EFB1 assigned in step S408 (step S409). It is noted that the user data written in the protected destination block EFB1 has been stored in the volatile write buffer 34 prior to step S409.

The power outage handler 66 writes the management data containing the address conversion table 37 not yet safely stored in the protected destination block EFB1 assigned in step S408 (step S410). In some embodiments, the management data (such as address conversion and other tables) are not written wholesale but rather just portions of such tables that have changed since being updated to the NAND 10.

When RMW processing has been halted, the power outage handler 66 adds at least the information containing the updated data (for example, the data received from the host 1) updated by the RMW processing and the logical address (LBA) of the updated data in the protected destination block EFB1 (step S411). The RMW processing will be described in detail later.

After this, the power outage handler 66 performs no further action on the NAND 10 and the battery 55 is disconnected.

Actions Performed During Outage Recovery

Figure 6:
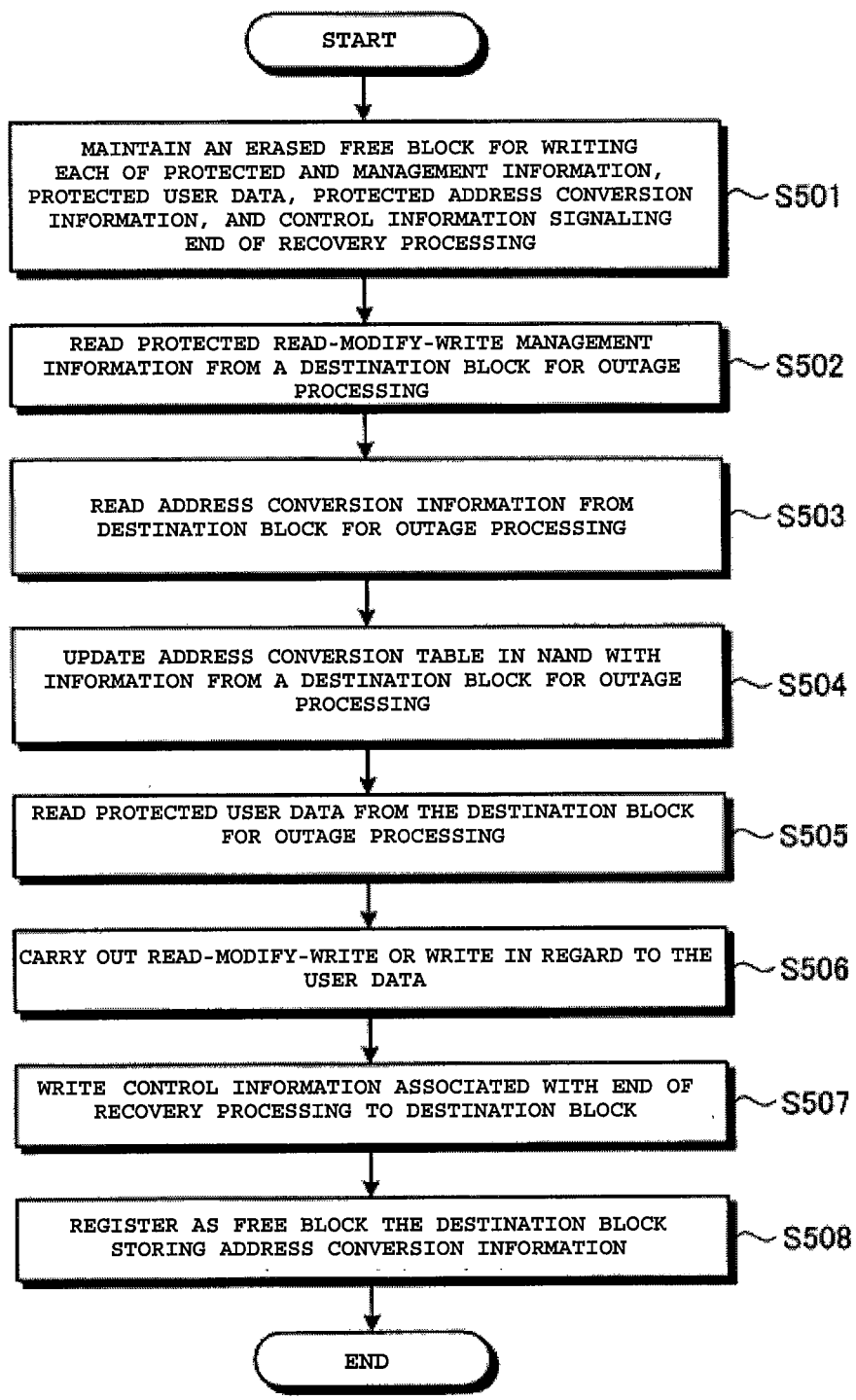
FIG. 6 is a flow chart showing a process of restarting after recovery from an outage.

FIG. 6 shows the actions performed by the power outage handler 66 during turning on external power supply 2 after a power interruption. It is noted that when power is supplied after an outage, it is possible for another unexpected outage to occur. Here, a free block chosen from the front of the FB manager list 38 as the new protected destination for management data (this will be the free block at the top of the FB management list 38) is erased. In this way, an erased free block is provided as another backup for the protected destination block EFB1. The newly erased free block (which is generally the free block at the top of the FB management list 38) protects against another power outage since the outage handler 66 has used the available erased free block after the previous unexpected power outage occurred. The free block to which data from the protected destination block EFB1 is written is chosen from the top of the FB manager list 38 and erased to give an erased free block. For the address conversion information held in the protected block EFB1 to be refreshed, the free block for the final write is taken from the top of the FB manager list 38 and erased to give an erased free block. Finally, for the end of outage processing to be signaled by writing the management data, the free block is taken from the top of the FB manager list 38 and erased to give an erased free block.

In this manner, during outage handling the FB manager list 38 provides the following:

The next erased protected destination block B1 to hold protected and management information, The next erased block B2 for final writing of the protected data, The next erased block B3 for the final writing of the protected address conversion information, The next erased block B4 to hold the control information signaling the end of recovery processing (step S501). The blocks B1 to B4 are chosen using the FB manager list 38. Thus, even when the backup battery has to be used repeatedly, the same block IDs are chosen and reused to obtain the erased blocks B1 to B4. This avoids write exhaustion in the NAND 10 when power outages occur repeatedly. If the FB manager list 38 is too small, additional free blocks can be obtained by a garbage collection process.

When turning on the backup battery after power failure occurs, if another power failure occurs the block identifiers of the blocks B1 to B4 may be stored in the protected destination block. In subsequent processing, upon reestablishing connection with external power source 2, the block IDs stored in the destination block can be read and the same blocks reused.

The power outage handler 66 then reads out the protected RMW management information (for example, the LBA of the updated data) from the protected block EFB1 and stores it temporarily in DRAM 32 (step S502).

The power outage handler 66 reads the address conversion information from the protected block EFB1 and stores it temporarily in DRAM 32, for example (the step S503).

During normal processing, upon turning on external power source 2, the NAND management table 202 is read out from the NAND 10 and written as the master table 36 to DRAM 32. The power outage handler 66 reads the address conversion information from the protected block EFB1, updates the address conversion table 37 in the master table 36, integrates it, and checks the integrity of the address conversion table 37 in the master table 36. The address conversion table 37 is then written to the erased block B3 prepared in step S501 (step S504).

The power outage handler 66 reads the user data from the protected block EFB1 and stores it temporarily in DRAM 32, for example (the step S505).

The power outage handler 66 performs RMW if the data reading step S505 is RMW-related, and write processing if only writing is required. Whether RMW or write, the data is written to the erased block B2 prepared in the step S501 (step S506). The RMW process will be described in detail later. With RMW, if a read error occurs when reading from the NAND 10, it is corrected by the error correction circuit 25.

The power outage handler 66 writes a completion of power-on processing entry after the power outage to the management data in the erased block B4 prepared in step S501 (step S507).

The power outage handler 66 registers the protected destination block EFB1 containing the information saved in the outage processing as a free block in the FB manager list 32 (step S508).

If another outage occurs during restart processing after an outage, the management and user data and address conversion data in volatile storage are written to a new protected erased block B1 prepared as in step S501.

Next, the RMW process will be explained based on FIGS. 7A to 7D and FIG. 8.

FIGS. 7A to 7D are conceptual diagrams showing the RMW processing during an outage. When an outage occurs, the power outage handler 66 (the backend 30) interrupts reading from the NAND controller 20 and halts error correction. This interrupts any RMW in progress at a time when the outage occurs, and RMW is restarted after the power is supplied. It is necessary to write to the NAND 10 by page. Therefore, during outage recovery, dummy data are used to fill out the page in the sector of the other LBA of the data stored in volatile DRAM 32 (see FIG. 7A); the sector data of the LBA1, the sector data of the LBA3, and the sector data of the LBA4). The page of data including the dummy data (see FIG. 7B) is written to the protected destination block in step S411 in FIG. 5.

Figure 8:
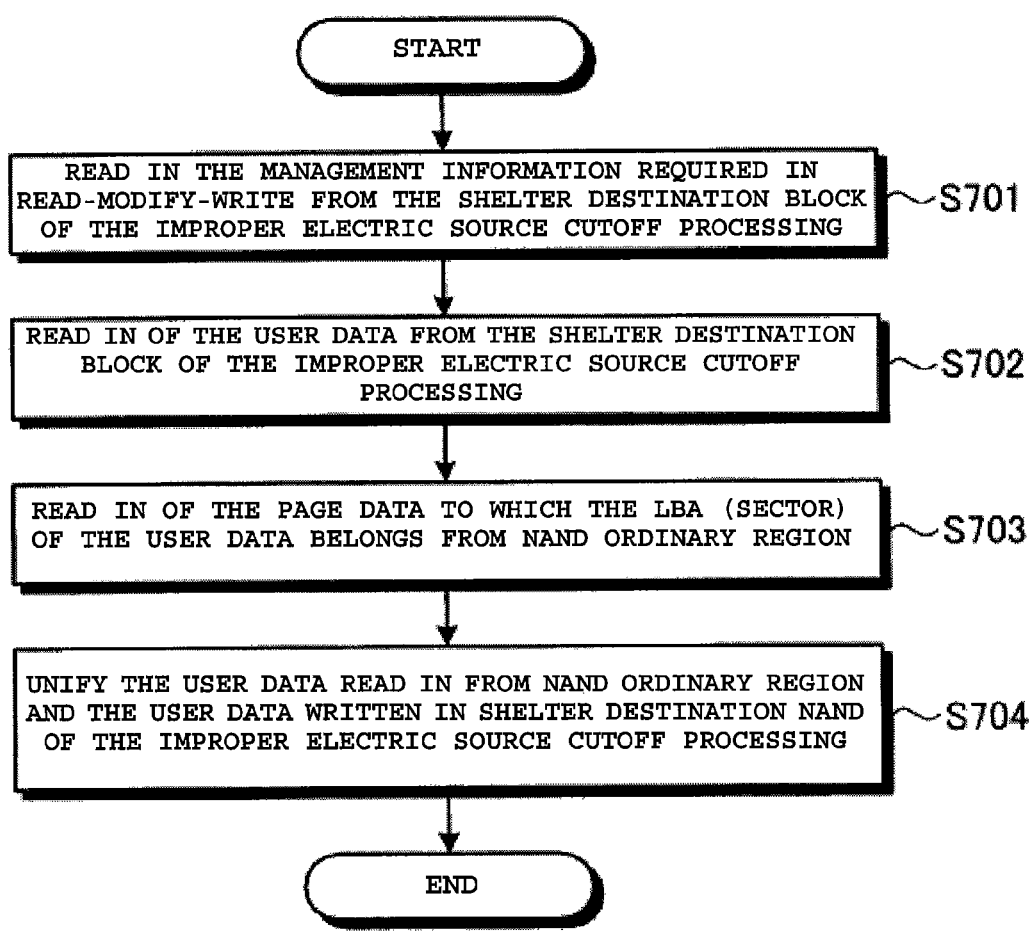
FIG. 8 is a flow chart showing the read-modify-write process during restart after recovery from an outage.

FIG. 8 shows the actions required for RMW during recovery after an unexpected power outage. The power outage handler 66 first reads the management information needed for RMW (for example, the LBA of the updated data) from the protected block EFB1 and stores it temporarily in DRAM 32 (step S701).

The logical address (LBA) of the data updated by RMW under backup power as described above may be used to retrieve the new address conversion table 37, from which RMW processing can be restarted.

RMW can also be restarted without retrieving the address conversion table 37 if the following lengthy information is used as the protected RMW data.

Any updated data

Data on the RMW target location: The page in NAND 10 to which the LBA (sector) of the updated RMW target data belongs The RMW-LBA map information: This is needed to distinguish updated from unchanged data in the NAND 10.

In this case, when the larger RMW dataset is used, as in step S411 in FIG. 5, the protected data are the RMW target data location and the RMW-LBA map, which are stored in the protected destination block EFB1. Furthermore, in step S502 in FIG. 6 and step S701 in FIGS. 7A to 7D, the RMW target data location and the RMW-LBA map are read from the block. It is also acceptable to protect only the RMW-LBA map. In this case, the RMW-LBA map and the address conversion table 37 are used to find the location of the RMW target data.

The power outage handler 66 next reads out the updated dummy RMW data from the protected block EFB1 and stores it temporarily in DRAM 32 (step S702).

The power outage handler 66 next reads a page of data (see FIG. 7D) in the NAND 10 to which the LBA (sector) of the RMW updated data belongs, either using the RMW target location data or from the address conversion table 37, and temporarily stores it in DRAM 32 etc. (step S703).

Figure 7A:
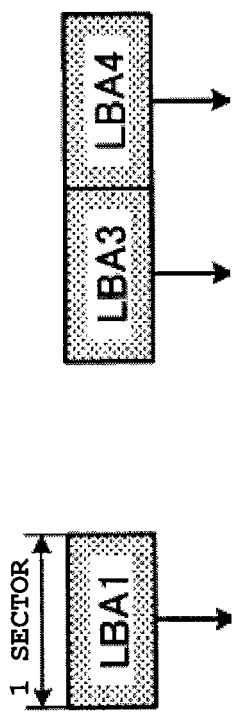
FIGS. 7A to 7D are conceptual diagrams showing a read-modify-write cycle during an outage and a restart process after recovery from an outage.
Figure 7B:
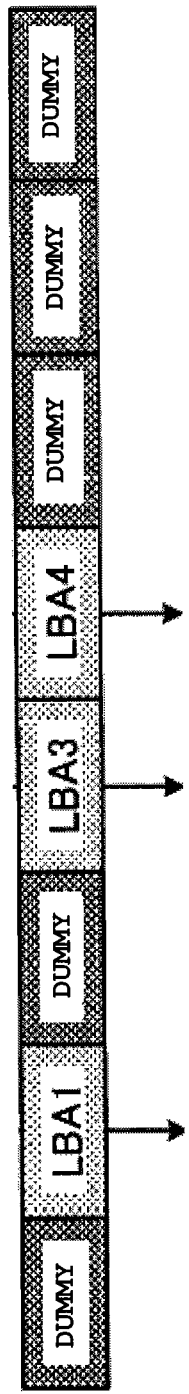
Figure 7C:
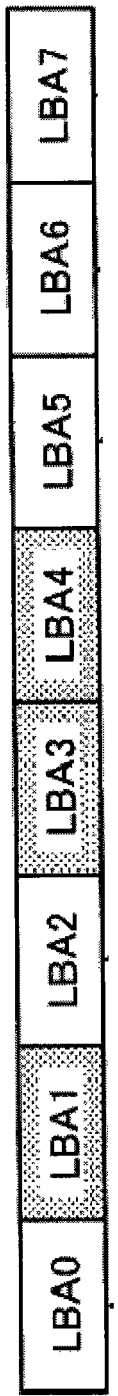
Figure 7D:

Next, as shown in FIG. 7C, the power outage handler 66 integrates the updated dummy data read from the protected block EFB1 with the page of data read from the normal region of the NAND 10 and writes the integrated page of data to NAND 10 (step S704). This write is accompanied by an update of the address conversion table 37 in the master table 36, and the updated address conversion table 37 is stored in the nonvolatile NAND 10.

The present embodiment is such that at least one erased free block is always set aside. This erased free block is used as the write destination to make protected data nonvolatile during a power outage. Thus, no erasing of the NAND is required, retries due to erasing failures are unnecessary, and processing time during the outage is not wasted. Thus, in this embodiment, less time is required to recover from an outage. Even when the backup power source has a small capacity, there is enough time to store the volatile data safely.

In this embodiment, block erasure and readout from the NAND 10 are interrupted by the outage handler, and the erased free block prepared beforehand prior to the outage is used to store the still-volatile data and the associated address conversion data in nonvolatile memory. This shortens the time needed to recover from an outage. Even with a low-capacity backup power, there is enough time to complete the required operations.

In this embodiment, error correction processing of data reading is suspended when an outage occurs. Since no time is needed to recover the data due to the error correction, less time is required to recover from an outage and even with a low-capacity backup power source there is enough time to complete all the necessary operations. By contrast, with the conventional technology reads are not discontinued after a power outage. Thus, if user data read from the nonvolatile memory is subjected to error correction, there might not be enough time for processing to complete before the battery cuts out.

In addition, in this embodiment, if the NAND is undergoing a garbage collection process when a power outage occurs, the garbage collection process is suspended. This shortens the time needed to recover from the outage, so that even a low-capacity backup power source is sufficient for the required processing to be completed.

In this embodiment, any RMW in progress at the time an outage occurs is interrupted. Therefore, less processing time is needed and even a low-capacity battery backup is sufficient for all operations to complete.

In this embodiment, the protected blocks used during outage recovery (the erased block to hold the protected data, the erased block which is the final write destination of the protected data and the address conversion information associated with the protected data, and the erased block to hold the management information showing completion of outage processing) are prepared beforehand based on the free block manager list. Therefore, when there are repeated outage and recovery cycles, it is possible to reuse the same erased block and thereby prevent write exhaustion of the NAND.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a volatile memory;
   a nonvolatile memory including a plurality of blocks;
   a first processor configured to detect an interruption of power from an external source;
   a backup power source configured to temporarily supply power to components of the memory device when the first processor detects the interruption; and
   a second processor configure to:
      perform a first read operation to read data from the nonvolatile memory; and
      maintain one of the blocks as a designated block for storing contents of the volatile memory during the interruption, wherein the contents include information corresponding to a recovery process, and wherein
   when the first processor detects the interruption during the first read operation, the first processor controls the second processor to continue the first read operation using the power of the backup power source and prevents the second processor from carrying out new red operations on the nonvolatile memory.

2. The memory device according to claim 1, wherein the first processor is further configured, when the first processor detects the interruption, to control the second processor to carry out a write operation to write data in the volatile memory in the designated block of the nonvolatile memory, the data is written in the designated block after the first processor sends a write completion notification corresponding thereto to a host of the memory device.

3. The memory device according to claim 2, wherein the second processor is further configured to complete the write operation during the interruption.

4. The memory device according to claim 3, wherein an erased free block is prepared in the nonvolatile memory as the designated block for storing the data in the volatile memory during the interruption.

5. The memory device according to claim 2, wherein the first processor is further configured, during the interruption, to control the second processor to carry out operations to:
   read data stored in a data block of the nonvolatile memory before the first processor detects the interruption;
   read the data stored in the designated block during the interruption; and
   write the data and the second data together into a block of the nonvolatile memory.

6. The memory device according to claim 1, wherein the first processor is further configured, after detecting the interruption, to prevent the second processor from carrying out at least one of the following operations: an operation to erase data from the nonvolatile memory, an operation to write data in the nonvolatile memory, an operation to update information for mapping logical block addresses to physical locations in the nonvolatile memory, and an operation of error correction.

7. The memory device according to claim 1, wherein the data comprise at least one of information for mapping logical block addresses from a host of the memory device to physical memory locations in the nonvolatile memory and user data associated with a write command from the host.

8. The memory device according to claim 1, wherein data stored in a free block of the nonvolatile memory is erased during the interruption, before the data is written in the designated block.

9. The memory device according to claim 1, wherein when the first processor detects the interruption, the first processor transmits a command to control the second processor to carry out the write operation, and stops transmitting commands besides said command.

10. A memory device comprising:
a volatile memory configured to store write data;
a NAND memory including a plurality of blocks;
a first processor configured to detect an interruption of power from an external source;
a second processor configured to carry out a write operation to write the write data in the NAND memory; and
a backup power source configured to temporarily supply power to components of the memory device when the first processor detects the interruption, wherein
when the first processor detects the interruption, a source of power is changed from the external source to the backup power source, and the first processor controls the second processor to carry out the write operation to write the write data in the NAND memory and prevents the second processor from carrying out new write operations on the NAND memory.

11. The memory device according to claim 10, wherein the second processor carries out the write operation on a designated block of the NAND memory, the write data is written in the designated block after the first processor sends a write completion notification corresponding thereto to a host of the memory device.

12. The memory device according to claim 11, wherein the second processor is further configured to complete the write operation during the interruption.

13. The memory device according to claim 12, wherein an erased free block is prepared in the NAND memory as the designated block for storing the write data during the interruption.

14. The memory device according to claim 10, wherein the first processor is further configured, after detecting the interruption, to prevent the second processor from carrying out at least one of the following operations: an operation to erase data from the NAND memory, an operation to update information for mapping logical block addresses to physical locations in the NAND memory, and an operation of error correction.

15. The memory device according to claim 10, wherein the first processor is further configured, during the interruption, to control the second processor to carry out operations to:
read second write data stored in a data block of the NAND memory before the interruption;
read the write data stored in the NAND memory during the interruption; and
write the write data and the second write data together into a block of the NAND memory.

16. The memory device according to claim 10, wherein the write data comprise at least one of information for mapping logical block addresses from a host of the memory device to physical memory locations in the NAND memory and user data associated with a write command from the host.

17. The memory device according to claim 10, wherein data stored in a free block of the NAND memory is erased during the interruption, before the write data is written in the designated block.

18. The memory device according to claim 10, wherein
when the first processor detects the interruption, the first processor transmits a command to control the second processor to carry out the write operation, and stops transmitting commands besides said command.

19. The memory device according to claim 10, wherein each of the blocks includes an upper page and a lower page.

20. A memory device comprising:
a volatile memory;
a nonvolatile memory including a plurality of blocks;
a first control means for detecting an interruption of power from an external source;
a backup power source configured to temporarily supply power to components of the memory device when the first control means detects the interruption; and
a second control means for:
performing a first read operation to read data from the nonvolatile memory; and
maintaining one of the blocks as a designated block for storing contents of the volatile memory during the interruption, wherein the contents include information corresponding to a recovery process, and wherein
when the first control means detects the interruption during the first read operation, the first control means controls the second control means to continue the first read operation using the power of the backup power source and prevents the second control means from carrying out new read operations on the nonvolatile memory.

* * * * *